(12) United States Patent
Warashina

(10) Patent No.: US 8,847,080 B2
(45) Date of Patent: Sep. 30, 2014

(54) LAMINATED WIRING BOARD

(75) Inventor: Yoshihisa Warashina, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 103 days.

(21) Appl. No.: 13/378,110

(22) PCT Filed: Jun. 3, 2010

(86) PCT No.: PCT/JP2010/059457
§ 371 (c)(1),
(2), (4) Date: Feb. 13, 2012

(87) PCT Pub. No.: WO2010/147000
PCT Pub. Date: Dec. 23, 2010

(65) Prior Publication Data
US 2012/0132460 A1    May 31, 2012

(30) Foreign Application Priority Data
Jun. 17, 2009    (JP) .............................. P2009-144038

(51) Int. Cl.
*H05K 1/09* (2006.01)
*H01L 23/14* (2006.01)
*H01L 23/498* (2006.01)
*H01L 23/13* (2006.01)
*H01L 27/146* (2006.01)

(52) U.S. Cl.
CPC ........ *H01L 23/147* (2013.01); *H01L 23/49872* (2013.01); *H01L 2224/16225* (2013.01); *H01L 23/49822* (2013.01); *H01L 23/13* (2013.01); *H01L 27/14636* (2013.01); *H01L 23/49827* (2013.01); *H01L 2924/157* (2013.01); *H01L 2924/3011* (2013.01)
USPC .......................................... 174/256; 174/262

(58) Field of Classification Search
CPC ............ H01L 23/147; H01L 23/49822; H01L 23/49827; H01L 23/49872; H01L 23/13; H01L 2924/3011; H01L 2224/16225; H01L 2924/157; H01L 27/14636
See application file for complete search history.

(56) References Cited

U.S. PATENT DOCUMENTS 6,221,769 B1 * 4/2001 Dhong et al. ................. 438/667
7,030,481 B2 * 4/2006 Chudzik et al. .............. 257/700
(Continued)

FOREIGN PATENT DOCUMENTS

| JP | 2005-136266 | 5/2005 |
|----|-------------|--------|
| JP | 2006-521022 | 9/2006 |
| JP | 2007-012896 | 1/2007 |

(Continued)

*Primary Examiner* — Ishwarbhai B Patel
(74) *Attorney, Agent, or Firm* — Drinker Biddle & Reath LLP

(57) ABSTRACT

In a multilayer wiring board, a low resistance silicon substrate having a predetermined resistivity and a high resistance silicon substrate having a resistivity higher than the predetermined resistivity are stacked while interposing an insulating layer therebetween. The low resistance silicon substrate is provided with an electric passage part surrounded by a ring-shaped groove, while a wiring film electrically connected to the electric passage part through an opening of the insulating layer is disposed on a rear face of the high resistance silicon substrate and an inner face of a recess. Since the high resistance silicon substrate is thus provided with the wiring film, an optical semiconductor element and an electronic circuit element which differ from each other in terms of the number and positions of electrode pads can be electrically connected to each other on the front and rear face sides of the multilayer wiring board.

7 Claims, 9 Drawing Sheets

(56) References Cited

U.S. PATENT DOCUMENTS

| | | | |
|---|---|---|---|
| 7,081,412 B2 * | 7/2006 | Heschel | 438/700 |
| 7,795,713 B2 * | 9/2010 | Matsui | 257/678 |
| 7,800,002 B2 * | 9/2010 | Chujo et al. | 174/263 |
| 2002/0170173 A1 * | 11/2002 | Mashino | 29/852 |
| 2003/0038344 A1 * | 2/2003 | Palmer et al. | 257/621 |
| 2003/0086248 A1 * | 5/2003 | Mashino | 361/767 |

FOREIGN PATENT DOCUMENTS

| | | |
|---|---|---|
| JP | 2008-130933 | 6/2008 |
| JP | 2008-541473 | 11/2008 |
| JP | 2009-54824 | 3/2009 |

\* cited by examiner (a)

(b)

LAMINATED WIRING BOARD

TECHNICAL FIELD

The present invention relates to a multilayer wiring board such as an interposer board.

BACKGROUND ART

In electronic and optical devices, it has recently been proposed to construct devices having higher functions by hybrid connections of a plurality of elements. In the case of a hybrid device made by electrically connecting elements having functions different from each other (e.g., an optical semiconductor element and an electronic circuit element) in particular, the number of electrode pads and their positions vary between the elements, whereby a multilayer wiring board such as an interposer board is utilized.

Patent Literature 1 discloses a multilayer wiring board formed by stacking a plurality of ceramic substrates. While the ceramic substrates have various advantages, for example, in that their coefficient of linear expansion is smaller than that of resin-based substrates and that they can be flattened by polishing and the like, and techniques for providing them with through-hole electrodes have already been established, they are hard to form narrow-pitch wiring patterns and thus are not suitable for smaller sizes.

Therefore, techniques for employing silicon substrates in multilayer wiring boards have been under study in view of their capability of forming narrow-pitch wiring patterns in addition to their low coefficient of linear expansion and high flatness. Patent Literatures 2 and 3 disclose silicon substrates in which a portion surrounded by a ring-shaped groove (trench) having a depth equal to their thickness serves as an electric passage part.

CITATION LIST

Patent Literature

Patent Literature 1: Japanese Patent Application Laid-Open No. 2005-136266
Patent Literature 2: Japanese Translated International Application Laid-Open No. 2006-521022
Patent Literature 3: Japanese Translated International Application Laid-Open No. 2008-541473

SUMMARY OF INVENTION

Technical Problem

When the silicon substrates disclosed in Patent Literature 2 and 3 are employed in a multilayer wiring board, however, the electric passage part in each layer serves as a lead, whereby elements which differ from each other in terms of the number and positions of electrode pads cannot be electrically connected to each other.

It is therefore an object of the present invention to provide a multilayer wiring board by which elements different from each other in terms of the number and positions of electrode pads can be electrically connected to each other.

Solution to Problem

For achieving the above-mentioned object, the multilayer wiring board in accordance with the present invention comprises a low resistance silicon substrate including an electric passage part surrounded by a ring-shaped groove having a depth equal to a thickness thereof; a first insulating layer laid on a main face on first side of the low resistance silicon substrate and formed with a first opening penetrating therethrough in the thickness direction so as to correspond to the electric passage part; and a high resistance silicon substrate laid on a main face on the first side of the first insulating layer and formed with a first recess having a depth equal to a thickness thereof so as to correspond to the first opening; wherein the low resistance silicon substrate has a predetermined resistivity, and the first high resistance silicon substrate has a resistivity higher than the predetermined resistivity; and wherein a first wiring film is disposed on a main face on the first side of the first high resistance silicon substrate and an inner face of the first recess while interposing a first insulating film, and the first wiring film is electrically connected to the electric passage part through the first opening.

In this multilayer wiring board, the low resistance silicon substrate having a predetermined resistivity and the first high resistance silicon substrate having a resistivity higher than the predetermined resistivity are laid on the first side and the second side of the first insulating layer, respectively. The low resistance silicon substrate is provided with an electric passage part surrounded by a ring-shaped groove, while the first wiring film electrically connected to the electric passage part through the first opening of the first insulating layer is disposed on the main face on the first side of the first high resistance silicon substrate and the inner face of the first recess while interposing the first insulating film. Since the first high resistance silicon substrate is thus provided with the first wiring film, elements which differ from each other in terms of the number and positions of electrode pads can be electrically connected to each other on the first side and the second side of the multilayer wiring board.

Preferably, the first recess is formed such that an end part on second side of the first recess is included in an end face on the first side of the electric passage part when seen in the thickness direction of the first high resistance silicon substrate. This structure allows peripheral portions of the end part on the second side of the first recess to support the electric passage part, thereby improving mechanical strength.

Preferably, the first recess is formed such as to become broader from a main face on second side of the first high resistance silicon substrate to the main face on the first side thereof. This structure makes it easier to form the first wiring film on the inner face of the first recess, so as to prevent disconnections and the like from occurring within the first recess, whereby the electric connection between the electric passage part and the first wiring film can be ensured.

Here, it is preferred for the first recess to be formed such that an end part on the first side of the first recess is included in an end face on the first side of the electric passage part when seen in the thickness direction of the first high resistance silicon substrate. In this structure, the whole inner face of the first recess broadening from the second side to the first side is included in the end face on the first side of the electric passage part. This allows peripheral portions of the whole first recess to support the electric passage part, thereby improving mechanical strength.

Preferably, a void is formed within the ring-shaped groove. This structure can attain electric insulation between the electric passage part and its peripheral portions while inhibiting electric capacity from increasing.

An electrode film may be disposed on an end face on second side of the electric passage part. This allows elements having functions different from each other to be mounted on the main face on the first side of the first high resistance silicon substrate and the main face on the second side of the low resistance silicon substrate, whereby the device as a whole can be made thinner.

The multilayer wiring board may further comprise a second insulating layer laid on a main face on second side of the low resistance silicon substrate and formed with a second opening penetrating therethrough in the thickness direction so as to correspond to the electric passage part; and a second high resistance silicon substrate laid on a main face on the second side of the second insulating layer and formed with a second recess having a depth equal to a thickness thereof so as to correspond to the second opening; wherein the second high resistance silicon substrate has a resistivity higher than the predetermined resistivity; and wherein a second wiring film is disposed on a main face on the second side of the second high resistance silicon substrate and an inner face of the second recess while interposing the second insulating film, and the second wiring film is electrically connected to the electric passage part through the second opening. This allows elements having functions different from each other to be laid on the main face on the first side of the first high resistance silicon substrate and the main face on the second side of the second high resistance silicon substrate, so that elements varying in terms of the number and positions of electrode pads can be mounted, while a predetermined thickness can be secured in the device, so as to improve its mechanical strength.

Advantageous Effects of Invention

The present invention can electrically connect elements which are different from each other in terms of the number and positions of electrode pads to each other by using a silicon substrate.

DESCRIPTION OF EMBODIMENTS

Figure 1:
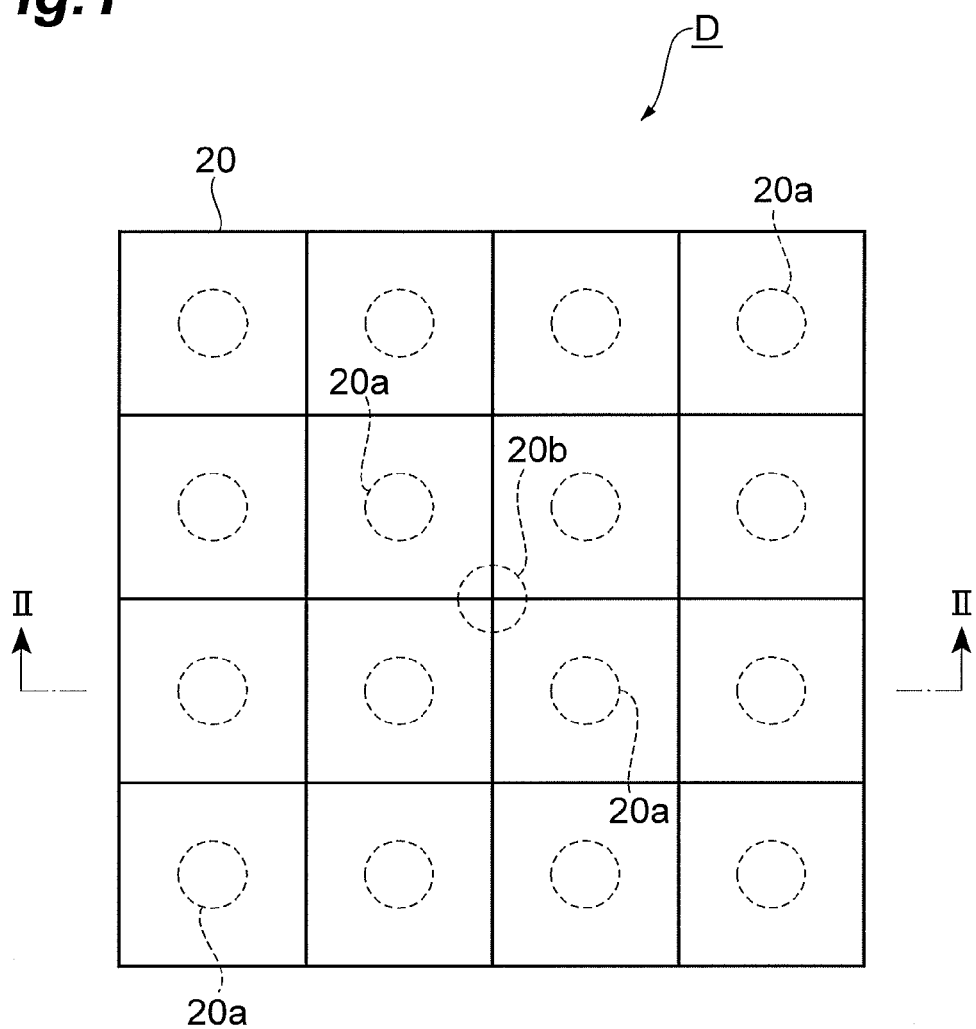
[FIG. 1] is a plan view of a first embodiment of a device equipped with the multilayer wiring board in accordance with the present invention.
Figure 2:
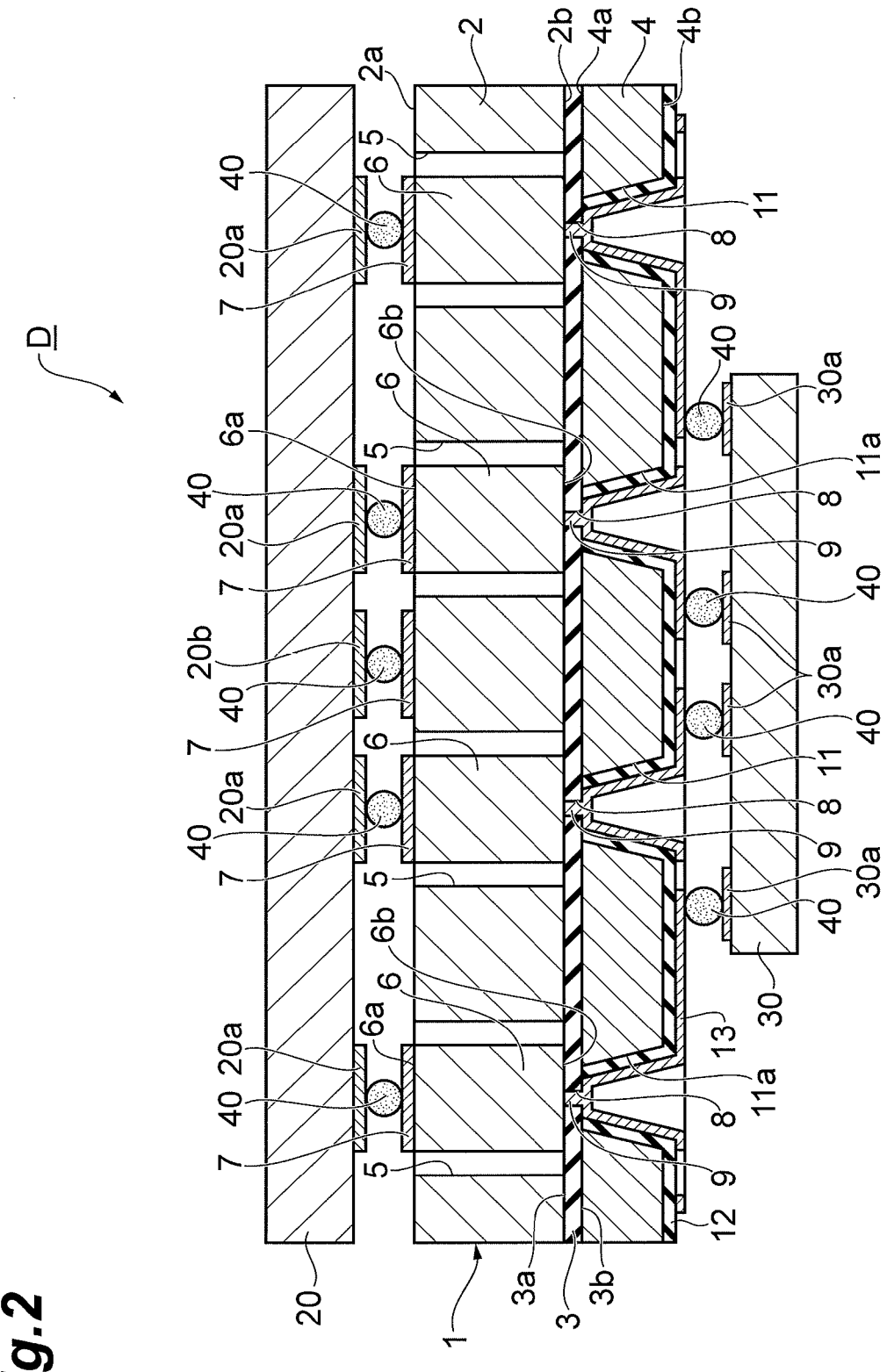
[FIG. 2] is a sectional view of the device taken along the line II-II of FIG. 1.
Figure 3:
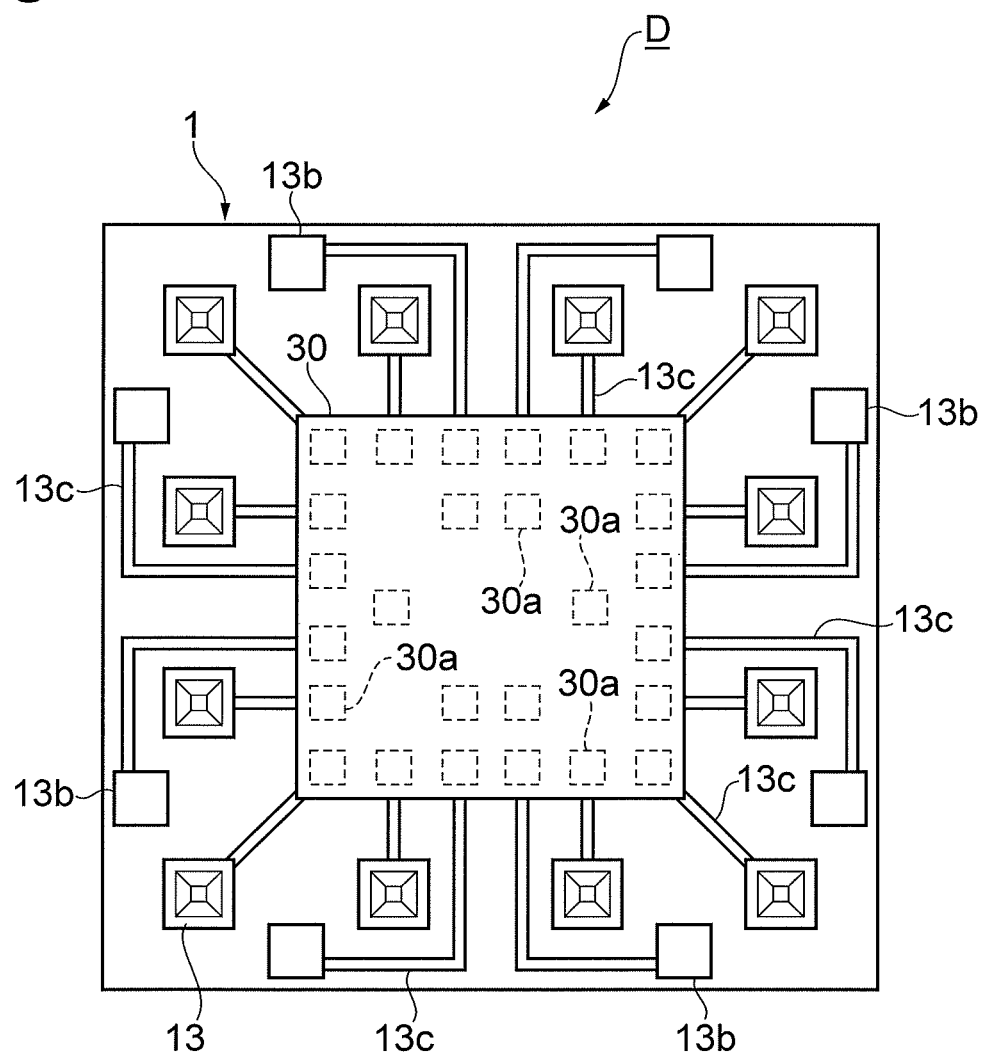
[FIG. 3] is a bottom plan view of the device of FIG. 1.

In the following, preferred embodiments of the present invention will be explained in detail with reference to the drawings. In the drawings, the same or equivalent parts will be referred to with the same signs while omitting their overlapping descriptions.
[First Embodiment]
FIG. 1 is a plan view of the first embodiment of a device equipped with the multilayer wiring board in accordance with the present invention. FIG. 2 is a sectional view of the device taken along the line of FIG. 1, while FIG. 3 is a bottom plan view of the device of FIG. 1. In this device D, as illustrated in FIGS. 1 to 3, an optical semiconductor element 20 and an electronic circuit element 30, each shaped like a rectangular sheet, are respectively mounted on the front face side (second side) and rear face side (first side) of a rectangular-sheet-shaped multilayer wiring board 1 which is an interposer board.

The optical semiconductor element 20 is a multichannel optical element (an array light-receiving element of 4×4 channels here), while the electronic circuit element 30 is a processing IC such as an amplifier array. When the optical semiconductor element 20 has a light-receiving part with a relatively large size, the size of the electronic circuit element 30 becomes smaller than that of the optical semiconductor element 20. Since making the electronic circuit element 30, whose manufacturing process is complicated, larger than necessary is less meritorious in terms of cost, the optical semiconductor element 20 and the electronic circuit element 30 are hybrid-connected to each other through the multilayer wiring board 1 adapted to change pitches.

Figure 4:
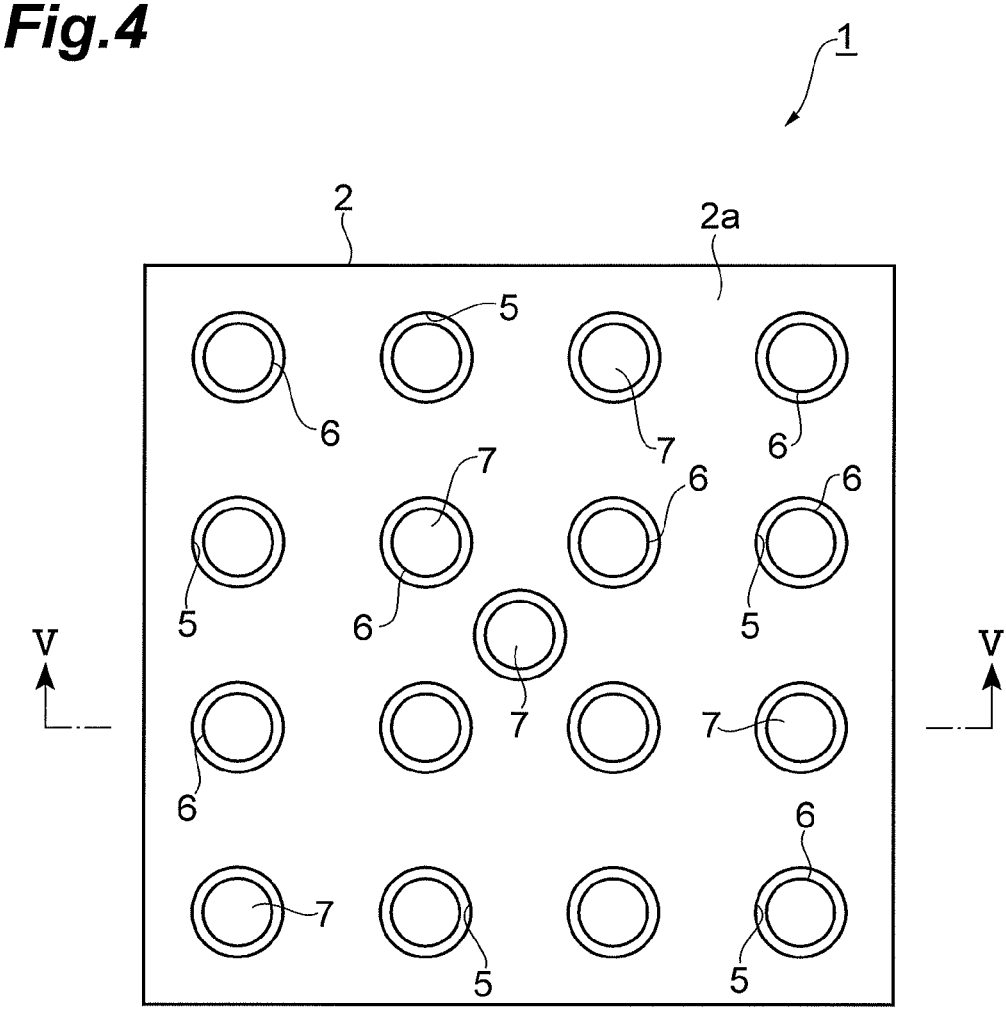
[FIG. 4] is a plan view of the multilayer wiring board of FIG. 1.
Figure 5:
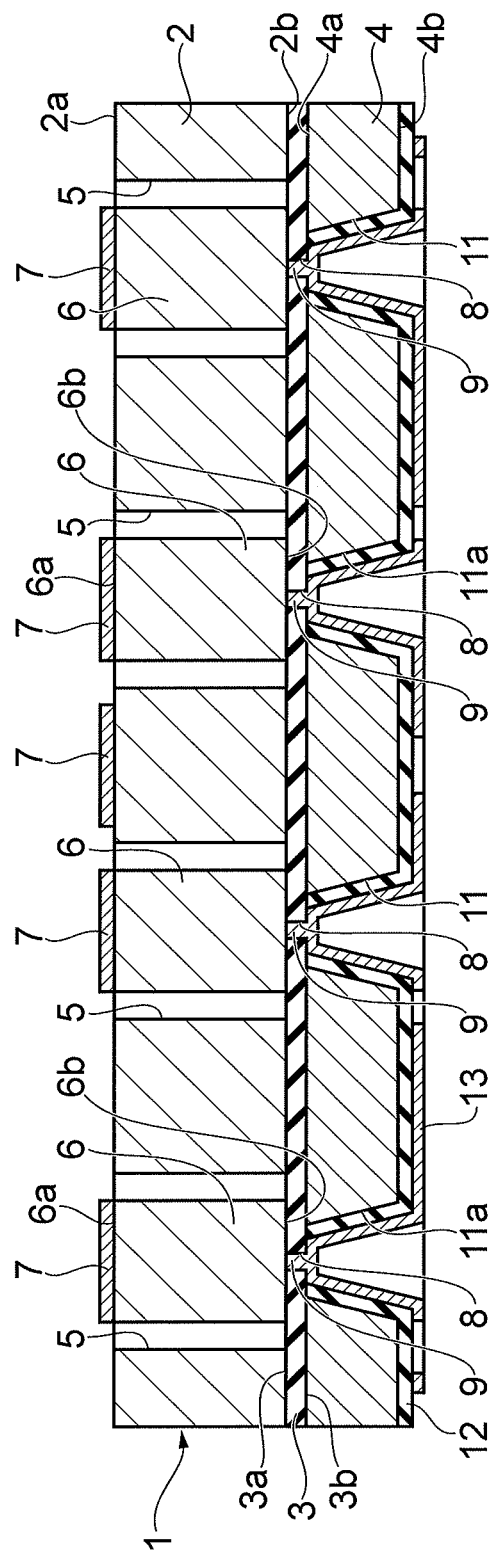
[FIG. 5] is a sectional view of the multilayer wiring board taken along the line V-V of FIG. 4.
Figure 6:
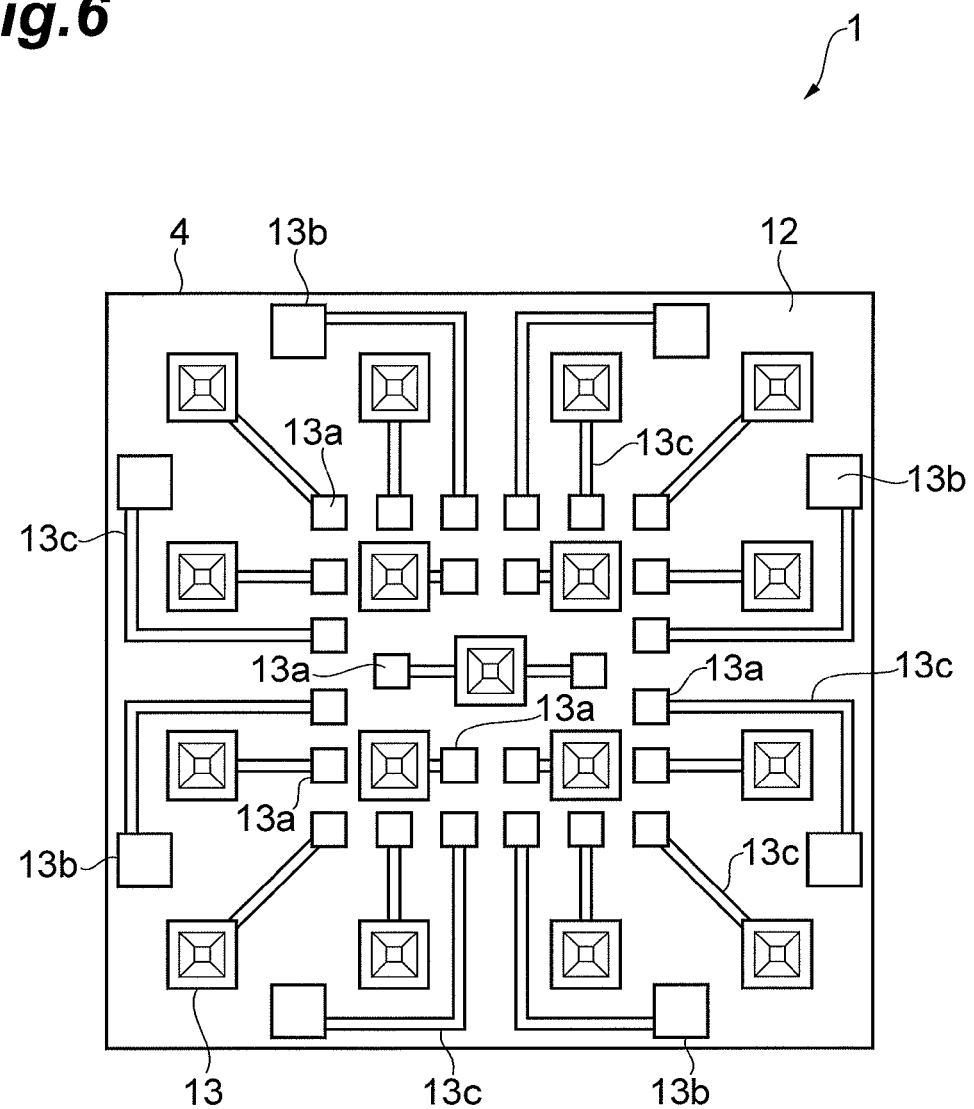
[FIG. 6] is a bottom plan view of the multilayer wiring board of FIG. 4.

FIG. 4 is a plan view of the multilayer wiring board of FIG. 1. FIG. 5 is a sectional view of the multilayer wiring board taken along the line V-V of FIG. 4, while FIG. 6 is a bottom plan view of the multilayer wiring board of FIG. 4. As illustrated in FIGS. 4 to 6, the multilayer wiring board 1 comprises a low resistance silicon substrate 2, an insulating layer (first insulating layer) 3 laid on the rear face (main face on the first side) 2b of the low resistance silicon substrate 2, and a high resistance silicon substrate (first high resistance silicon substrate) 4 laid on the rear face (main face on the first side) 3b of the insulating layer 3. That is, the multilayer wiring board 1 is an SOI (Silicon On Insulator) substrate in which the low resistance silicon substrate 2 and the high resistance silicon substrate 4 are connected to each other through the insulating layer 3.

The low resistance silicon substrate 2 has a predetermined resistivity (e.g., 0.01 Ω·cm), while the high resistance silicon substrate 4 has a resistivity (e.g., 3 kΩ·cm) higher than the predetermined resistivity. The insulating layer 3 is an oxide film made of silicon oxide or the like.

The low resistance silicon substrate 2 includes cylindrical electric passage parts 6 each surrounded by a circular ring-shaped groove 5 having a depth equal to its thickness. The ring-shaped groove 5 has a depth extending from the front face 2a to rear face 2b of the low resistance silicon substrate 2 such that its bottom face becomes the front face 3a of the insulating layer 3. The electric passage parts 6 are disposed not only in the arrangement of 4×4 but also at the center thereof so as to correspond to (i.e., oppose in the thickness direction) anode pads 20a and a common cathode pad 20b in the optical semiconductor element 20 (see FIGS. 1 and 2). Each electric passage part 6 is defined by the ring-shaped groove 5 formed by silicon deep etching, while electric insulation is attained by the air within the ring-shaped groove 5 (or other electrically insulating materials filling the same).

An electrode film 7 made of a metal such as Cr/Pt/Au is disposed on the end face 6a on the front face side of each electric passage part 6. The electrode film 7 is formed on the end face 6a of the electric passage part 6 by resistive heating, vapor deposition by an electron beam, sputtering, plating, or the like, so as to be brought into ohmic contact with the electric passage part 6. Each electrode film 7 is connected to its corresponding anode pad 20a or common cathode pad 20b of the optical semiconductor element 20 through a solder bump 40 (see FIGS. 1 and 2).

The insulating layer 3 is formed with openings (first openings) 8 penetrating therethrough in the thickness direction thereof so as to correspond to (i.e., oppose in the thickness direction) the respective electric passage parts 6 of the low resistance silicon substrate 2. Each opening 8 is formed such as to be included in the end face 6b on the rear face side of its corresponding electric passage part 6 when seen in the thickness direction of the insulating layer 3. A conductive film 9 made of a metal such as Cr/Pt/Au is formed within each opening 8, so as to be brought into ohmic contact with the electric passage part 6.

The high resistance silicon substrate 4 is formed with recesses (first recesses) 11 having a depth equal to the thickness thereof so as to correspond to (i.e., oppose in the thickness direction) the respective openings 8 of the insulating layer 3. Each recess 11 has a depth extending from the rear face 4b to front face 4a of the high resistance silicon substrate 4 such that its bottom face becomes the rear face 3b of the insulating layer 3.

Each recess 11 is formed by wet etching or the like so as to become broader from the front face 4a to rear face 4b of the high resistance silicon substrate 4 (i.e., taper down from the rear face 4b to front face 4a of the high resistance silicon substrate 4). More specifically, when seen in the thickness direction of the high resistance silicon substrate 4, each recess 11 is formed into a truncated pyramid such that the end part (opening) on the rear face side of the recess 11 is included in the end face 6b of its corresponding electric passage part 6. Consequently, when seen in the thickness direction of the high resistance silicon substrate 4, the end part (bottom part) on the front face side of the recess 11 is also included in the end face 6b of the electric passage part 6 as a matter of course. When seen in the thickness direction of the insulating layer 3, the opening 8 of the insulating layer 3 is included not only in the end face 6b of its corresponding electric passage part 6, but also in the end part (bottom part) on the front face side of its corresponding recess 11.

A wiring film (first wiring film) 13 made of a metal such as Cr/Pt/Au is disposed on the rear face 4b and the inner faces 11a of the recesses 11 while interposing an insulating film (first insulating film) 12 which is an oxide or nitride film made of silicon oxide, silicon nitride, or the like. The insulating film 12 is removed from the end parts (bottom parts) on the front face side of the recesses 11, whereby the wiring film 13 is connected to the conductive film 9 at thus removed parts. As a consequence, the wiring film 13 is electrically connected to the electric passage parts 6 of the low resistance silicon substrate 2 through the openings 8 of the insulating layer 3.

The wiring film 13 patterned on the rear face 4b of the high resistance silicon substrate 4 has pad parts 13a disposed so as to correspond to (i.e., oppose in the thickness direction) terminal electrode pads 30a of the electronic circuit element 30 (see FIGS. 2 and 3), external interface parts 13b for electrically connecting with externals in order to feed electric power and input and output signals, and wiring parts 13c for mutually connecting the pad parts 13a, the external interface parts 13b, and portions of the wiring film 13 within the recesses 11. The terminal electrode pads 30a of the electronic circuit element 30 are connected to the respective pad parts 13a through their corresponding solder bumps 40 (see FIGS. 2 and 3). Since the high resistance silicon substrate 4 itself has a high resistivity, high impedance is also maintained in terms of alternating current among the leads of the wiring film 13.

Since silicon wafers made by the CZ (Czochralski) process are hard to attain higher resistance (lower impurity content), it is desirable for the high resistance silicon substrate 4 to employ a silicon wafer made by the FZ (floating zone) process. While the upper limit for resistivity of silicon wafers is several 100 Ω·cm in the CZ process, the FZ process can attain a resistivity of several kΩ·cm or greater in silicon wafers. While it is also desirable for the low resistance silicon substrate 2 to use a silicon wafer made by the FZ process because of its low fluctuation in the impurity content, a silicon wafer made by the CZ process may also be employed, since the size of electric passage parts 6 is not so small.

The high resistance silicon substrate 4 is preferably made thinner, since this allows the electrodes to attain narrower pitches and higher electric resistance values therebetween. However, the thickness of the high resistance silicon substrate 4 is preferably on the order of several 10 to 100 μm, since it becomes weaker when too thin, and may be 200 or 300 μm when not used for high frequencies.

The thickness of the low resistance silicon substrate 2 is determined relative to the required electric resistance value. When the electric passage part 6 having a diameter of 100 μm is formed in the low resistance silicon substrate 2 having a resistivity of 0.01 Ω·cm, it yields 127 Ω/cm. Here, the electric passage part 6 attains electric resistance values of about 6Ω and about 1.3Ω when the low resistance silicon substrate 2 has thicknesses of 500 μm and 100 μm, respectively. When it is necessary for the electric passage part 6 to further lower the electric resistance value, the size of the electric passage part 6 may be made greater, such as to have a diameter of 200 μm, for example. When the thickness of the low resistance silicon substrate 2 is 100 μm here, the electric resistance value of the electric passage part 6 becomes 0.3Ω.

In the multilayer wiring board 1, as explained in the foregoing, the low resistance silicon substrate 2 having a predetermined resistivity and the high resistance silicon substrate 4 having a resistivity higher than the predetermined resistivity are respectively laid on the front face 3a and rear face 3b of the insulating layer 3 interposed therebetween. The low resistance silicon substrate 2 is provided with the electric passage parts 6 surrounded by the respective ring-shaped grooves 5, while the wiring film 13 electrically connected to the electric passage parts 6 through the openings 8 of the insulating layer 3 is disposed on the rear face 4b of the high resistance silicon substrate 4 and the inner faces 11a of the recesses 11. Since the high resistance silicon substrate 4 is thus provided with the wiring film 13, the optical semiconductor element 20 and electronic circuit element 30 different from each other in terms of the number and positions of electrode pads can be electrically connected to each other on the front face side and rear face side of the multilayer wiring board 1.

Combining the low resistance silicon substrate 2 and high resistance silicon substrate 4 together can secure mechanical strength and facilitate handling, even when the high resistance silicon substrate 4 is made thinner. This makes it unnecessary to provide wiring films on both front and rear face sides through insulating films, whereby the structure can be made simpler.

The recesses 11 of the high resistance silicon substrate 4 are formed such as to become broader from the front face 4a to rear face 4b of the high resistance silicon substrate 4. This makes it easier to form the wiring film 13 on the inner faces 11a of the recesses 11, so as to prevent disconnections and the like from occurring within the recesses 11, whereby the electric connection between the electric passage parts 6 of the low resistance silicon substrate 2 and the wiring film 13 can be ensured.

Each recess 11 is formed such that the end part (opening) on the rear face side of the recess 11 is included in the end face 6b of its corresponding electric passage part 6 when seen in the thickness direction of the high resistance silicon substrate 4. Since the recess 11 is formed such as to become broader from the front face 4a to rear face 4b of the high resistance silicon substrate 4, the end part (bottom part) on the front face side of the recess 11 is also included in the end face 6b of the electric passage part 6 when seen in the thickness direction of the high resistance silicon substrate 4. This allows peripheral portions of the whole recess 11 to support the electric passage part 6, thereby improving mechanical strength.

A void is formed within the ring-shaped groove 5 surrounding the electric passage part 6. This can attain electric insulation between the electric passage part 6 and its peripheral portions while inhibiting electric capacity from increasing. The mechanical strength is reinforced by the mounting of the semiconductor element 20 and thus becomes no problem in particular.

The electrode film 7 is disposed on the end face 6a on the front face side of the electric passage part 6 of the low resistance silicon substrate 2. This allows the optical semiconductor element 20 and electronic circuit element 30 having functions different from each other to be mounted on the front face 2a of the low resistance silicon substrate 2 and the rear face 4b of the high resistance silicon substrate 4, respectively, whereby the device D as a whole can be made thinner.

Figure 7:
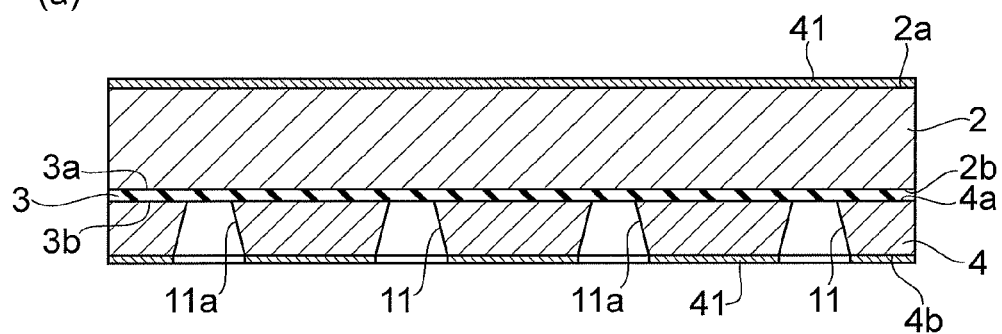
[FIG. 7] is a set of sectional views for respective manufacturing steps of the multilayer wiring board of FIG. 4.
Figure 7:
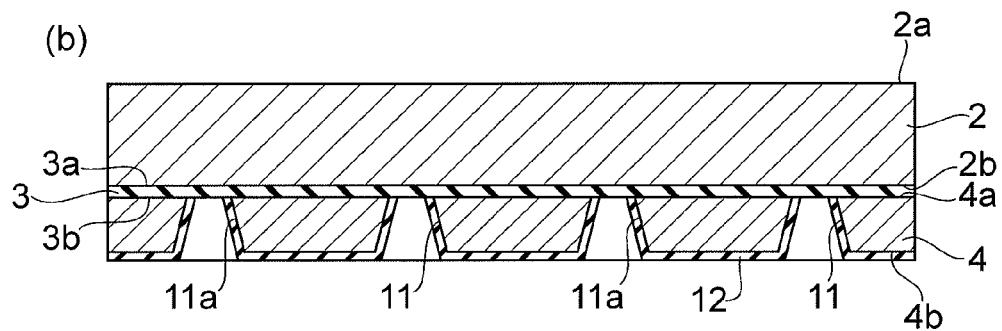
Figure 7:
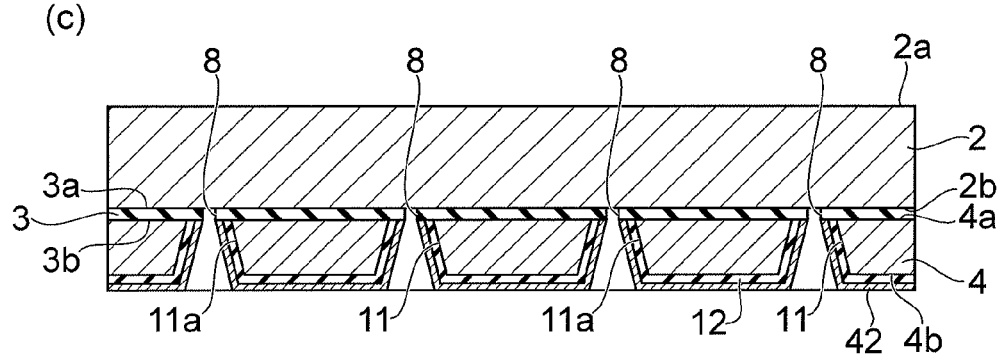
Figure 8:
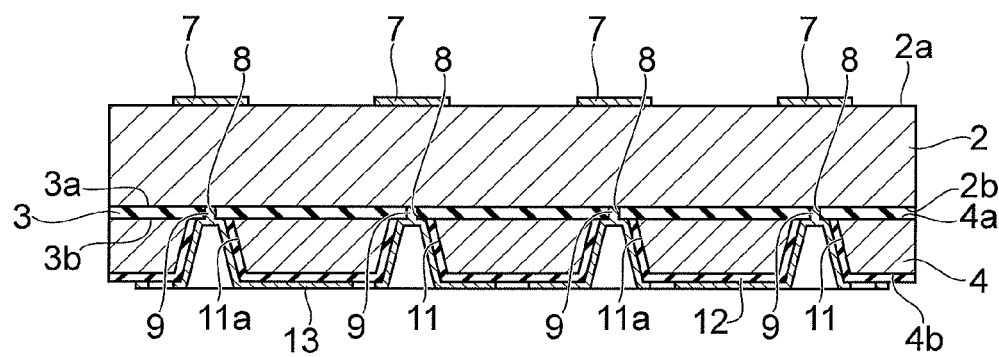
[FIG. 8] is a set of sectional views for respective manufacturing steps of the multilayer wiring board of FIG. 4.
Figure 8:
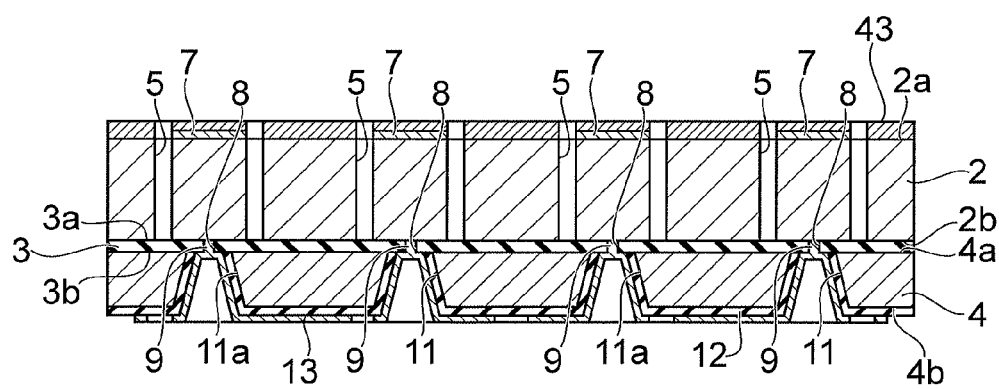

A method of manufacturing the multilayer wiring board 1 will now be explained with reference to FIGS. 7 and 8. In general, the following manufacturing steps are performed for each silicon wafer as a unit, while each multilayer wiring board 1 is obtained by dicing the silicon wafer.

First, as illustrated in FIG. 7(a), an SOI substrate in which the low resistance silicon substrate 2 and the high resistance silicon substrate 4 are connected to each other through the insulating layer 3 is prepared. Preferably, if possible, the front and rear faces 2a, 2b of the low resistance silicon substrate 2 are implanted with ions for ohmic connection. Subsequently, silicon nitride films 41 are formed on the front face 2a of the low resistance silicon substrate 2 and the rear face 2b of the high resistance silicon substrate 4, and the recesses 11 are formed while using the silicon nitride film 41 as a mask. When performing wet etching with an alkali solution such as KOH or TMAH, the insulating layer 3 acts as a stop layer.

When the front and rear faces 4a, 4b of the high resistance silicon substrate 4 have a surface orientation of (100), its OF (orientation flat) surface typically has a surface orientation of (110). When the recess 11 shaped like a truncated pyramid is set such that its opening has sides parallel and perpendicular to the OF, wet etching makes the inner face of the recess 11 attain a surface orientation of (111), whereby the inner face of the recess (111) becomes a surface tilted by 54.7° with respect to the front face 4a of the high resistance silicon substrate 4.

Subsequent to forming the recesses 11, as illustrated in FIG. 7(b), the silicon nitride films 41 are removed, and the insulating film 12 is formed on the rear face 4b of the high resistance silicon substrate 4 and the inner faces 11a of the recesses 11 by thermal oxidation or CVD. The oxide film formed on the front face 2a of the low resistance silicon substrate 2 when making the insulating film 12 by thermal oxidization is unnecessary and thus is removed by dry etching.

Next, as illustrated in FIG. 7(c), a resist mask 42 is formed on the rear face 4b of the high resistance silicon substrate 4 and the inner faces 11a of the recesses 11 by a spray coater, and the openings 8 are formed in the insulating layer 3 by dry etching. When ion implantation is necessary for ohmic connection, the front face 2a of the low resistance silicon substrate 2 is implanted with ions at this stage, and so is the rear face 2b of the low resistance silicon substrate 2 through the openings 8.

Subsequently, as illustrated in FIG. 8(a), the resist mask 42 is removed, and a metal film is formed by vapor deposition on the front face 2a of the low resistance silicon substrate 2, within the openings 8 of the insulating layer 3, and on the insulating film 12. Then, by wet etching using a resist mask or by liftoff, the electrode film 7 is formed on the front face 2a of the low resistance silicon substrate 2, while the wiring film 13 is formed on the rear face 4b of the high resistance silicon substrate 4 and the inner faces 11a of the recesses 11 while interposing the insulating film 12. Annealing is performed at this stage if necessary for alloying metals or for ohmic connections.

Next, as illustrated in FIG. 8(b), a resist mask 43 is formed on the front face 2a of the low resistance silicon substrate 2, so as to produce the ring-shaped grooves 5 on the low resistance silicon substrate 2 by DRIE (Deep Reactive Ion Etching), thereby defining the electric passage parts 6. Finally, the resist mask 43 is removed, so as to complete the multilayer wiring board 1.

[Second Embodiment]

Figure 9:
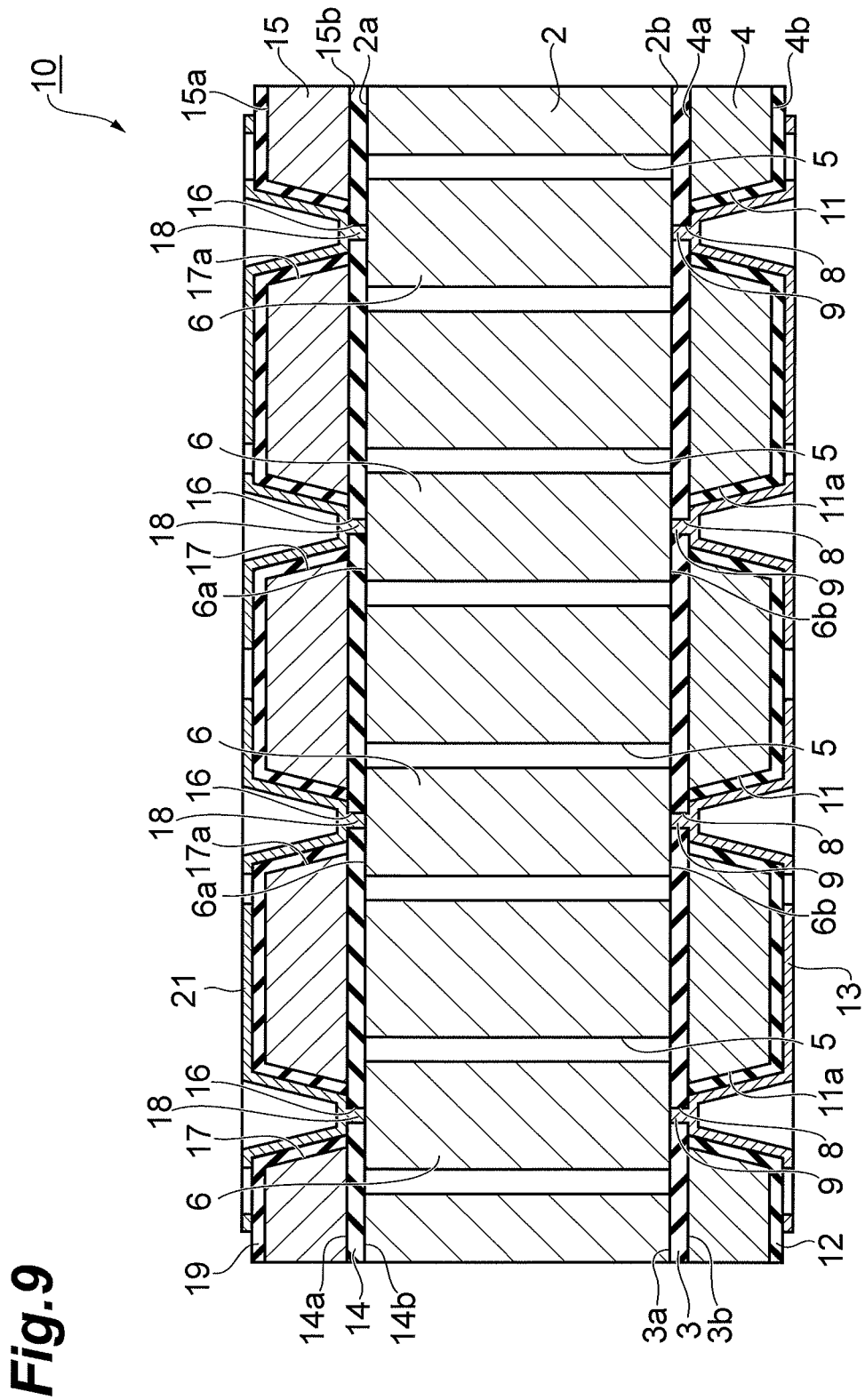
[FIG. 9] is a sectional view of a second embodiment of the multilayer wiring board in accordance with the present invention.

FIG. 9 is a sectional view of the second embodiment of the multilayer wiring board in accordance with the present invention. As illustrated in FIG. 9, this multilayer wiring board 10 further comprises an insulating layer (second insulating layer) 14 laid on the front face (main face on the second side) 2a of the low resistance silicon substrate 2 and a high resistance silicon substrate (second high resistance silicon substrate) 15 laid on the front face (main face on the second side) 14a of the insulating layer 14 in addition to the structure of the multilayer wiring board 1 mentioned above. The high resistance silicon substrate 15 has a resistivity (e.g., 3 kΩ·cm) higher than the predetermined resistivity of the low resistance silicon substrate 2.

As with the insulating layer 3, the insulating layer 14 is formed with openings (second openings) 16 penetrating therethrough in its thickness direction so as to correspond to (i.e., oppose in the thickness direction) the respective electric passage parts 6 of the low resistance silicon substrate 2. As with the high resistance silicon substrate 4, the high resistance silicon substrate 15 is formed with recesses (second recesses) 17 having a depth equal to its thickness so as to correspond to (i.e., oppose in the thickness direction) the respective openings 16 of the insulating layer 14.

As with the conductive film 9, a conductive film 18 is disposed within the openings 16 of the insulating layer 14. As with the insulating film 12 and the wiring film 13, a wiring film (second wiring film) 21 is disposed on the front face 15a of the high resistance silicon substrate 15 and inner faces 17a of the recesses 17 while interposing an insulating film (second insulating film) 19. The wiring film 21 is electrically connected to the electric passage parts 6 of the low resistance silicon substrate 2 through the conductive film 18 within the openings 16 of the insulating layer 14.

Thus constructed multilayer wiring board 10 allows elements having functions different from each other to be mounted on the rear face 4b of the high resistance silicon substrate 4 and the front face 15a of the high resistance silicon substrate 15, respectively, whereby elements varying in terms of the number and positions of electrode pads can be mounted. This also makes it possible for the device D to secure a predetermined thickness and improve its mechanical strength.

The multilayer wiring board 10 is manufactured as follows. That is, it is obtained by preparing two multilayer wiring boards 1, each of which is constructed as mentioned above, and connecting their front faces 2a of low resistance silicon substrates 2 to each other. For connecting the front faces 2a of the low resistance silicon substrates 2 to each other, electrode films 7 may be disposed on the end faces 6a on the front face side of the electric passage parts 6 and joined together by solder or the like, or the front faces 2a of the low resistance silicon substrates 2 may be joined to each other by surface activated bonding without forming the electrode films 7 on the end faces 6a of the electric passage parts 6. When a silicon wafer having a diameter of 6 inches is used for the low resistance silicon substrate 2, for example, its standard thickness is 625 μm, whereby the multilayer wiring board 1 can attain a thickness of 1 mm or greater.

Meanwhile, the size of the openings of the recesses 11, 17 in the high resistance silicon substrates 4, 15 depends on the thickness of the high resistance silicon substrates 4, 15. When the high resistance silicon substrates 4, 5 have a thickness of 200 μm, while the inner faces of the recesses 11, 17 are surfaces tilted by 54.7° with respect to the front face 4a of the high resistance silicon substrate 4, the expansions by the tilt are 140 μm each on both sides, whereby setting the length of each side of the bottom parts of the recesses 11, 17 to 50 μm makes each side of the opening of each recess have a length of 330 μm. Therefore, even when arranged densely, the recesses 11, 17 attain the smallest pitch of about 400 μm. Hence, when the electrode pad pitch is smaller than 400 μm in each of the elements mounted on the front and rear face sides, the multilayer wiring board 10 provided with the wiring films 21, 13 on the front and rear face sides, respectively, is advantageous.

The present invention is not limited to the above-mentioned embodiments.

For example, in the first embodiment, the recesses 11 of the high resistance silicon substrate 4 may not be formed such as to become broader from the front face 4a to rear face 4b of the high resistance silicon substrate 4. As long as the end part on the front face side (bottom part) of each recess 11 is included in the end face 6b on the rear face side of its corresponding electric passage part 6 of the low resistance silicon substrate 2, the electric passage part 6 is supported by peripheral portions of the end part on the front face side (bottom part) of the recess 11 in this case as well, whereby mechanical strength improves.

The laying of the insulating layer 3 on the rear face 2b of the low resistance silicon substrate 2, the high resistance silicon substrate 4 on the rear face 3b of the insulating layer 3, the insulating layer 14 on the front face 2a of the low resistance silicon substrate 2, the high resistance silicon substrate 15 on the front face 14a of the insulating layer 14, and the like may be performed not directly but indirectly through some layers.

INDUSTRIAL APPLICABILITY

The present invention can electrically connect elements which are different from each other in terms of the number and positions of electrode pads to each other by using a silicon substrate.

REFERENCE SIGNS LIST 1, 10 . . . multilayer wiring board; 2 . . . low resistance silicon substrate; 2a . . . front face (main face on the second side); 2b . . . rear face (main face on the first side); 3 . . . insulating layer (first insulating layer); 3b . . . rear face (main face on the first side); 4 . . . high resistance silicon substrate (first high resistance silicon substrate); 4b . . . rear face (main face on the first side); 5 . . . ring-shaped groove; 6 . . . electric passage part; 6a . . . end face (end face on the second side); 6b . . . end face (end face on the first side); 7 . . . electrode film; 8 . . . opening (first opening); 11 . . . recess (first recess); 11a . . . inner face; 12 . . . insulating film (first insulating film); 13 . . . wiring film (first wiring film); 14 . . . insulating film (second insulating film); 14a . . . front face (main face on the second side); 15 . . . high resistance silicon substrate (second high resistance silicon substrate); 15a . . . front face (main face on the second side); 16 . . . opening (second opening); 17 . . . recess (second recess); 17a . . . inner face; 19 . . . insulating film (second insulating film); 21 . . . wiring film (second wiring film)

The invention claimed is:

1. A multilayer wiring board comprising:
a low resistance silicon substrate including an electric passage part surrounded by a ring-shaped groove having a depth equal to a thickness thereof;
a first insulating layer laid on a main face on first side of the low resistance silicon substrate and formed with a first opening penetrating therethrough in the thickness direction so as to correspond to the electric passage part; and
a high resistance silicon substrate laid on a main face on the first side of the first insulating layer and formed with a first recess having a depth equal to a thickness thereof so as to correspond to the first opening;
wherein the low resistance silicon substrate has a predetermined resistivity, and the first high resistance silicon substrate has a resistivity higher than the predetermined resistivity; and
wherein a first wiring film is disposed on a main face on the first side of the first high resistance silicon substrate and an inner face of the first recess while interposing a first insulating film, and the first wiring film is electrically connected to the electric passage part through the first opening.

2. A multilayer wiring board according to claim 1, wherein the first recess is formed such that an end part on second side of the first recess is included in an end face on the first side of the electric passage part when seen in the thickness direction of the first high resistance silicon substrate.

3. A multilayer wiring board according to claim 1, wherein the first recess is formed such as to become broader from a main face on second side of the first high resistance silicon substrate to the main face on the first side thereof.

4. A multilayer wiring board according to claim 3, wherein the first recess is formed such that an end part on the first side of the first recess is included in an end face on the first side of the electric passage part when seen in the thickness direction of the first high resistance silicon substrate.

5. A multilayer wiring board according to claim 1, wherein a void is formed within the ring-shaped groove.

6. A multilayer wiring board according to claim 1, wherein an electrode film is disposed on an end face on second side of the electric passage part.

7. A multilayer wiring board according to claim 1, further comprising:
a second insulating layer laid on a main face on second side of the low resistance silicon substrate and formed with a second opening penetrating therethrough in the thickness direction so as to correspond to the electric passage part; and
a second high resistance silicon substrate laid on a main face on the second side of the second insulating layer and formed with a second recess having a depth equal to a thickness thereof so as to correspond to the second opening;

wherein the second high resistance silicon substrate has a resistivity higher than the predetermined resistivity; and wherein a second wiring film is disposed on a main face on the second side of the second high resistance silicon substrate and an inner face of the second recess while interposing the second insulating film, and the second wiring film is electrically connected to the electric passage part through the second opening.

\* \* \* \* \*